(12) United States Patent
Chen et al.

(10) Patent No.: US 9,577,408 B2
(45) Date of Patent: Feb. 21, 2017

(54) TUNABLE LASER WITH HIGH THERMAL WAVELENGTH TUNING EFFICIENCY

(71) Applicant: Futurewei Technologies, Inc., Plano, TX (US)

(72) Inventors: Hongmin Chen, Davis, CA (US); Xuejin Yan, Santa Clara, CA (US); Rongsheng Miao, San Jose, CA (US); Xiao Shen, San Bruno, CA (US); Zongrong Liu, Pleasanton, CA (US)

(73) Assignee: Futurewei Technologies, Inc., Plano, TX (US)

( * ) Notice: Subject to any disclaimer, the term of this patent is extended or adjusted under 35 U.S.C. 154(b) by 0 days.

(21) Appl. No.: 14/986,239

(22) Filed: Dec. 31, 2015

(65) Prior Publication Data

US 2016/0118772 A1    Apr. 28, 2016

Related U.S. Application Data

(63) Continuation of application No. 14/266,248, filed on Apr. 30, 2014, now Pat. No. 9,231,361.

(60) Provisional application No. 61/817,731, filed on Apr. 30, 2013.

(51) Int. Cl.
| | |
|---|---|
| H01S 5/06 | (2006.01) |
| H01S 3/042 | (2006.01) |
| H01L 21/311 | (2006.01) |
| H01S 5/026 | (2006.01) |
| H01S 5/042 | (2006.01) |
| H01S 5/20 | (2006.01) |
| H01S 5/0625 | (2006.01) |
| H01S 5/125 | (2006.01) |
| H01S 5/50 | (2006.01) |
| G02B 6/12 | (2006.01) |

(52) U.S. Cl.
CPC ........... *H01S 5/0612* (2013.01); *H01L 21/311* (2013.01); *H01S 3/042* (2013.01); *H01S 5/0261* (2013.01); *H01S 5/0425* (2013.01); *H01S 5/209* (2013.01); *G02B 2006/12176* (2013.01); *H01S 5/06256* (2013.01); *H01S 5/125* (2013.01); *H01S 5/5045* (2013.01)

(58) Field of Classification Search
CPC ...... H01S 5/0612; H01S 5/209; H01S 5/0261; H01S 5/0425; H01S 3/042; H01S 5/06256; H01S 5/125
See application file for complete search history.

(56) References Cited

U.S. PATENT DOCUMENTS

| | | | |
|---|---|---|---|
| 6,174,748 B1 * | 1/2001 | Jeon | G02B 6/1228 372/45.01 |
| 2006/0180830 A1 * | 8/2006 | Alavi | B82Y 20/00 257/184 |

* cited by examiner

*Primary Examiner* — Dung Nguyen
(74) *Attorney, Agent, or Firm* — Futurewei Technologies, Inc.

(57) ABSTRACT

A monolithically integrated thermal tunable laser comprising a layered substrate comprising an upper surface and a lower surface, and a thermal tuning assembly comprising a heating element positioned on the upper surface, a waveguide layer positioned between the upper surface and the lower surface, and a thermal insulation layer positioned between the waveguide layer and the lower surface, wherein the thermal insulation layer is at least partially etched out of an Indium Phosphide (InP) sacrificial layer, and wherein the thermal insulation layer is positioned between Indium Gallium Arsenide (InGaAs) etch stop layers.

22 Claims, 8 Drawing Sheets

US 9,577,408 B2

TUNABLE LASER WITH HIGH THERMAL WAVELENGTH TUNING EFFICIENCY

CROSS-REFERENCE TO RELATED APPLICATIONS

The present application is a continuation of U.S. patent application Ser. No. 14/266,248, now allowed, filed on Apr. 30, 2014, and entitled "Tunable Laser With High Thermal Wavelength Tuning Efficiency", which claims priority to U.S. Provisional Patent Application 61/817,731, filed Apr. 30, 2013 by Hongmin Chen, et. al., and entitled "Tunable Laser With High Thermal Wavelength Tuning Efficiency", which is incorporated herein by reference as if reproduced in its entirety.

STATEMENT REGARDING FEDERALLY SPONSORED RESEARCH OR DEVELOPMENT

Not applicable.

REFERENCE TO A MICROFICHE APPENDIX

Not applicable.

BACKGROUND

A monolithically integrated laser may be a laser that is fabricated on a single wafer, such as an Indium Phosphide (InP) wafer. A tunable laser may be a laser with an output wavelength that may be continuously altered in a controlled manner across a significant wavelength range. A tunable laser may be controlled by injecting current or heat into a tuning apparatus. Such heat and/or current may cause the tuning apparatus to selectively change, which may result in a concentrated optical output of the desired wavelength. Many structures may be employed to control optical output in the monolithically integrated laser and/or in other optical transmission contexts.

SUMMARY

In one embodiment, the disclosure includes a monolithically integrated thermal tunable laser comprising a layered substrate comprising an upper surface and a lower surface, and a thermal tuning assembly comprising a heating element positioned on the upper surface, a waveguide layer positioned between the upper surface and the lower surface, and a thermal insulation layer positioned between the waveguide layer and the lower surface, wherein the thermal insulation layer is at least partially etched out of an InP sacrificial layer, and wherein the thermal insulation layer is positioned between Indium Gallium Arsenide (InGaAs) etch stop layers.

In another embodiment, the disclosure includes a thermal tuning assembly for a monolithically integrated laser prepared by a process comprising growing a layered substrate, wherein the layered substrate comprises an Indium Aluminum Arsenide (InAlAs) sacrificial layer positioned between a plurality of InGaAs etch stop layers, attaching a heating element on a surface of the layered substrate, and etching a suspended thermal isolation structure into the layered substrate by etching out at least a portion of the InAlAs sacrificial layer and employing the InGaAs etch stop layers to contain the etch.

In another embodiment, the disclosure includes a method of fabricating a thermal tuning assembly comprising growing a layered substrate, wherein the layered substrate comprises an InP sacrificial layer positioned between a plurality of InGaAs etch stop layers, positioning a heating element on an upper surface of the layered substrate, and etching a suspended thermal isolation structure into the layer substrate by etching out at least part of the InP sacrificial layer and employing the InGaAs etch stop layers to contain the etch.

These and other features will be more clearly understood from the following detailed description taken in conjunction with the accompanying drawings and claims.

BRIEF DESCRIPTION OF THE DRAWINGS

For a more complete understanding of this disclosure, reference is now made to the following brief description, taken in connection with the accompanying drawings and detailed description, wherein like reference numerals represent like parts.

DETAILED DESCRIPTION

Figure 1:
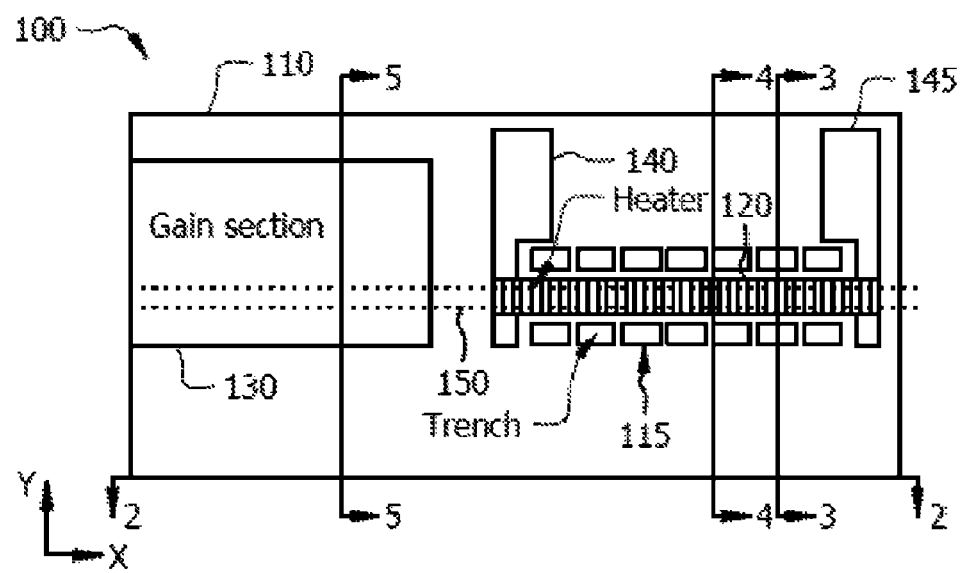
FIG. 1 is a top view of an embodiment of a thermal tuning assembly for a monolithically integrated tunable laser.

It should be understood at the outset that, although an illustrative implementation of one or more embodiments are provided below, the disclosed systems and/or methods may be implemented using any number of techniques, whether currently known or in existence. The disclosure should in no way be limited to the illustrative implementations, drawings, and techniques illustrated below, including the exemplary designs and implementations illustrated and described herein, but may be modified within the scope of the appended claims along with their full scope of equivalents.

Monolithically integrated tunable lasers may generally be fabricated through butt-joint of a gain Multiple Quantum Wells (MQW) material with passive material on an InP substrate. The gain MQW may provide gain with current injection, while mirrors (e.g. Distributed Bragg Reflectors (DBRs)) and phase sections may be fabricated with the passive material. Wavelength tuning may be achieved by tuning the refractive index of the DBR section and phase sections. The tuning mechanism may include current injection tuning and/or thermal tuning through a local heater. Thermal tuning may comprise lower tuning loss than current injection tuning, which may result in a narrower laser line width. For example, a line width of less than 400 kilohertz (kHz) may be achieved with thermal tuning, compared to five megahertz (MHz) for current injection tuning. However, current injection may comprise lower tuning power consumption than thermal tuning for a similar wavelength tuning range. In addition, power consumption of a thermal tuning assembly (e.g. about 300 milliWatts (mW)) may be significantly greater than power consumption for a current based tuning assembly (e.g. about 10 mW) across a similar wavelength range.

Suspension structures may be employed to reduce power consumption for thermal tunable lasers, for example in Micro-ElectroMechanical System (MEMS) structures and monolithic integrated tunable lasers with narrow line width and high thermal tuning efficiency (e.g. tuning efficiency similar to current injection tuning). The suspension structures may provide thermal insulation for the tuning section and may be fabricated through sacrificial layer etch. For example, a suspension structure may be fabricated with sacrificial layer etch by InGaAs and/or Indium (In) Gallium (Ga) Arsenide (As) Phosphide (P) (InGaAsP) as a sacrificial layer and InP as a stop layer. However, InGaAs may comprise a lower thermal conductivity than InP (e.g. 5 Watts per centimeter in Kelvin (W/(cm K)) and 68 W/(cm K), respectively). Further, growing thick ternary layers (In(1−x)GaxAs, where x is a selected value) and/or quaternary (InxGa(1−x)AsyP(1−y) where x and y are a selected values) layers with low stress may be difficult as the composition change (e.g. (x,y)) may result in a lattice mismatch with the InP and may introduce strain. A thick layer with strain may result in manufacturing defects and unreliable structures. A thick sacrificial layer (e.g. several micrometers (μm)) may be needed to avoid sticking during manufacture, which may result from capillarity forces during removal of a rinsing solution following an under etching of the sacrificial layer.

Disclosed herein is a thermal tuning assembly with a suspended isolation structure for mitigating heat loss into the associated substrate (e.g. a wafer). The suspended isolation structure may be fabricated with an InGaAs etch stop layer and a sacrificial layer comprising InP and/or InAlAs, which may provide greater thermal conductivity into the suspended isolation structure while providing for a thick sacrificial layer with low stress related to lattice mismatch. The inclusion of an InAlAs layer inside the InP layer may result in faster etch times, as InP may etch faster along a vertical axis, while InAlAs may etch faster along a horizontal axis. Further, a dielectric, such as Silicone Nitride (SiN) and/or Silicon Dioxide ($SiO_2$) may be applied to the substrate at various points in the manufacturing process to protect the lasers waveguide layer and/or the wafer as a whole from the etching solution during a multistage etching process that results in the suspended isolation structure.

FIG. 1 is a top view of an embodiment of a thermal tuning assembly 100 for a monolithically integrated tunable laser. FIG. 1 may depict the thermal tuning assembly 100 in a longitudinal x axis and a latitudinal y axis, where vertical z axis is not shown. The monolithically integrated tunable laser and the tuning assembly 100 may be manufactured on a single wafer, which may undergo various processes as discussed herein to become a layered substrate 110. The tuning assembly 100 may be manufactured into and/or onto the layered substrate 110. The tuning assembly 100 may comprise a gain section 130, a heating element 120, a front mirror 140, a back mirror 145, and a suspended thermal isolation structure 115. The tuning assembly 100 may be configured to receive an optical signal 150, tune the optical signal 150 with mirrors 140 and 145, and increase the gain of the optical signal 150 for transmission out of the laser. Longitudinal cross section 2 and latitudinal cross sections 3, 4, and 5 are depicted in FIGS. 2, 3, 4, and 5, respectively.

The optical signal 150 may be any data carrying signal that employs light as a transmission medium. For example, a light source may emit light, which may then be modulated to carry data. The optical signal 150 may be modulated with data before or after passing through the thermal tuning assembly 100, depending on the embodiment. It should be noted that optical signal 150 is depicted with a dotted line to indicate that optical signal 150 may not be visible from a top view and may travel via a waveguide layer as discussed below. The optical signal 150 may pass through the back mirror 145 and exit the thermal tuning assembly 100 through the gain section 130, or vice versa. In an alternate embodiment, the optical signal 150 may be received via the gain section 130, be reflected by the back mirror 145, and exit the thermal tuning assembly 100. The gain section 130 may be any structure configured in the layered substrate 110 that amplifies the optical signal 150 for transmission, for example via energy transference.

The tuning assembly 100 may tune the optical signal 150 with front mirror 140, back mirror 145, and heating element 120. Front mirror 140 and back mirror 145 may be any devices configured to reflect light passing through a waveguide. For example, mirror 140 and/or mirror 145 may be configured to selectively reflect all light, but light of a selected wavelength. Accordingly, light that is not of the selected wavelength may remain between the mirrors 140 and 145, while light of the selected wavelength may be allowed to pass. The mirror 140, 145, or both may be configured to allow different wavelengths of light to pass through depending on local temperature. Accordingly, heating element 120 may selectively change the local temperature to selectively tune the wavelength of optical signal 150. Heating element 120 may comprise Titanium (Ti), Platinum (Pt), Ti/Pt alloy, Tantalum nitride (TaN), or combinations thereof, and may heat the one or both mirrors 140 and 145 and/or an associated waveguide in the layered substrate 110 based on electrical input in order to selectively tune the optical signal 150.

Suspended thermal isolation structure 115 may be a cavity (e.g. a trench) manufactured into the layered substrate 110 to concentrate heat from the heating element 120 in the portion of the tuning element 100 near the mirrors 140 and 145. The suspended thermal isolation structure 115 may likewise isolate the heat from the rest of the layered substrate 110. By reducing the amount of heat that escapes into the layered substrate 110, the heating element 120 may heat the mirror(s) 140 and/or 145 with less energy, which may reduce the power consumption of the tuning assembly 100. The suspended thermal isolation structure 115 may extend into the layered substrate 110 along either side of the heating element 120 and may extend in a layer below the heating element 120 as discussed further herein below. Accordingly, the suspended thermal isolation structure 115 may isolate the heating element 120 from the layered substrate 110 in three dimensions, while leaving some material between passages into the suspended thermal isolation structure 115 to maintain the structural integrity of the heating element 120 and associated cladding with respect to the layered substrate 110.

Figure 2:
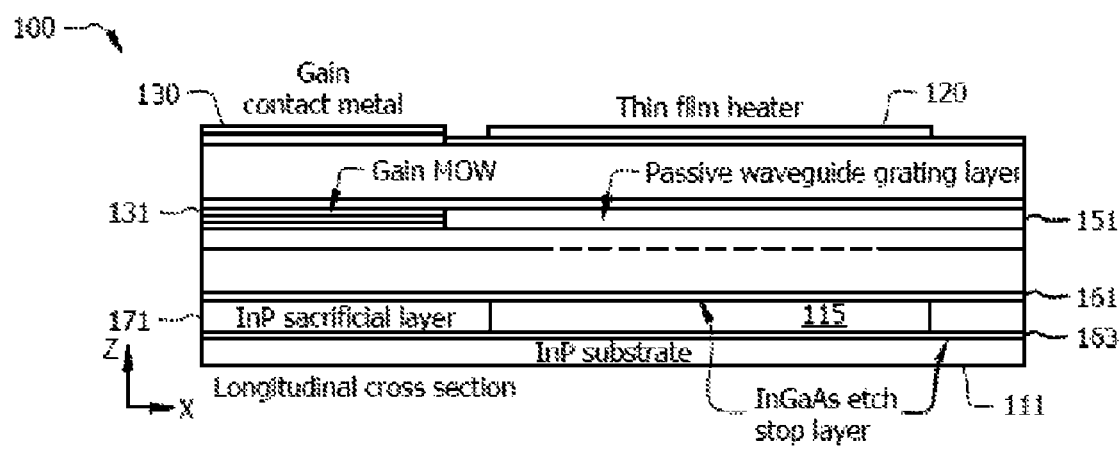
FIG. 2 is a longitudinal cross section of the schematic diagram of FIG. 1.

FIG. 2 is a longitudinal cross section of the schematic diagram of FIG. 1. FIG. 2 may depict the thermal tuning assembly 100 in the longitudinal x axis and the vertical z axis, where the latitudinal y axis is not shown. As shown in FIG. 2, the suspended thermal isolation structure 115 may isolate the heating element 120 (e.g. thin film heater), from an InP substrate 111, which may form the base of the wafer. As shown in FIG. 2, the layered substrate 110 may further comprise a waveguide layer 151, which may provide a passive grating for channeling and/or focusing the optical signal. The gain section 130 may further comprise a contact metal on the upper surface of the layered substrate 110 and Multiple Quantum Wells (MQW) 131 positioned to receive light from the waveguide layer 151, both of which may be employed to amplify the optical signal 150 traversing the waveguide layer 151.

The suspended thermal isolation structure 115 may be etched out of the layered substrate 110 by employing an upper etch stop layer 161, a lower etch stop layer 163, and a sacrificial layer 171. The layers 161, 163 and 171 may comprise InGaAs, InGaAs, and InP, respectively. An etching material, such as an aqueous Hydrochloric Acid (HCl) solution may be employed to etch out the InP sacrificial layer 171, and the InGaAs etch stop layers 161 and 163 may prevent the etching solution from spreading to the rest of the layered substrate. Accordingly, a portion of the InP sacrificial layer 171 may be etched out (e.g. based on etching time) to create a suspended thermal isolation structure 115 with boundaries defined at least in part by the lower and upper etch stop layers 161 and 163, respectively.

Figure 3:
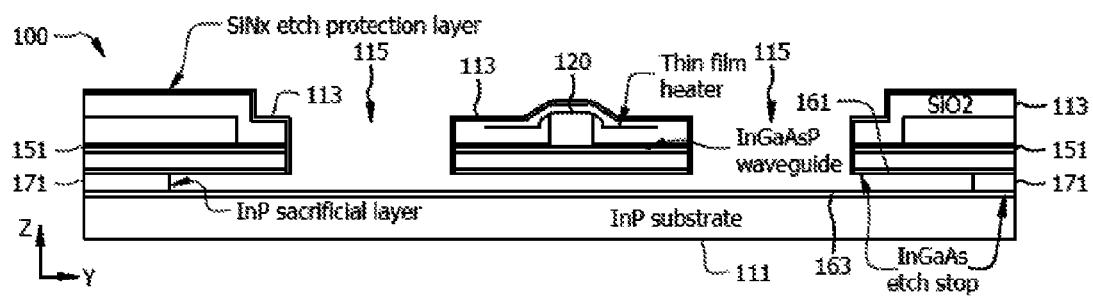
FIG. 3 is a first latitudinal cross section of the schematic diagram of FIG. 1.
Figure 4:
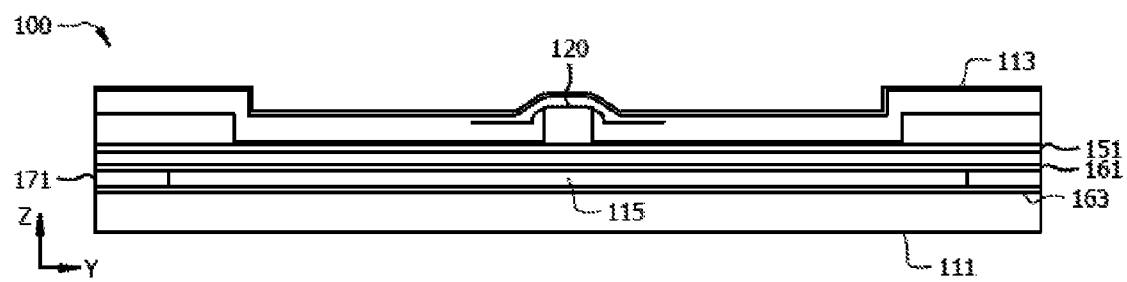
FIG. 4 is a second latitudinal cross section of the schematic diagram of FIG. 1.
Figure 5:
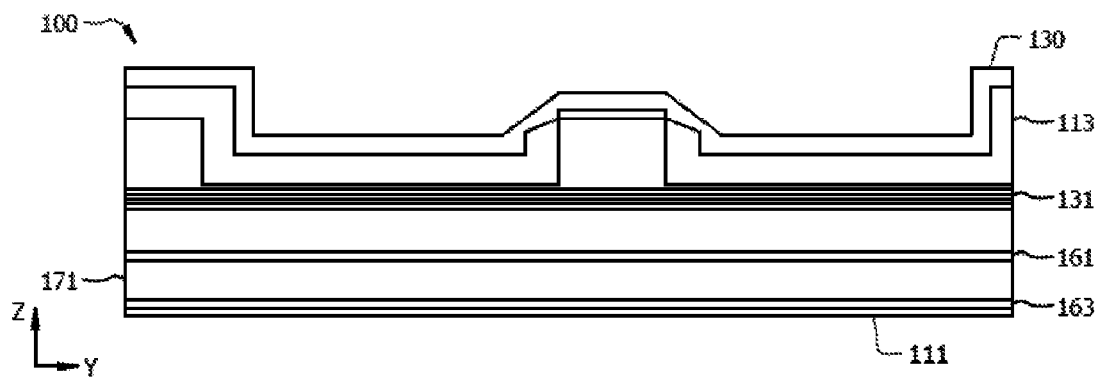
FIG. 5 a third latitudinal cross section of the schematic diagram of FIG. 1.

FIGS. 3-5 may depict the thermal tuning assembly 100 in the latitudinal y axis and the vertical z axis, where the longitudinal x axis is not shown. FIG. 3 is a first latitudinal cross section of the schematic diagram of FIG. 1, and may depict a cross section of tuning assembly 100 along latitudinal cross section 3. FIG. 3 depicts passages created to both partially isolate the heating element 120 from the remainder of the layered substrate 110 and provide a channel for etching materials to enter into the layered substrate to etch out the suspended thermal isolation structure 115. FIG. 3 depicts a dielectric layer 113, which may be applied to the layered substrate 110 to protect the other layers during etching. The dielectric layer 113 may comprise SiN, SiO$_2$, and/or other Silicon and Nitrogen based compounds (SiNx). Further, as shown in FIG. 3, the waveguide layer 151 may comprise InGaAsP.

FIG. 4 is a second latitudinal cross section of the schematic diagram of FIG. 1, and may depict a cross section of tuning assembly 100 along latitudinal cross section 4. As shown in FIG. 4, suspended thermal isolation structure 115 may extend along the InP sacrificial layer 171 below the heating element 120 in areas that lack the passages shown in FIG. 3. In such areas, the layers between the InP sacrificial layer 171 and the upper surface of the layered substrate 110 may remain unetched to provide structural support and/or integrity to the portion of the layered substrate 110 connected to the heating element 120. Accordingly, the etching solution may enter the layered substrate 110 through the passages and etch out the sacrificial layer 171 in both a longitudinal and a latitudinal direction until the desired suspended thermal isolation structure 115 is created. The etching process may occur at a predictable rate. As such, a rinsing solution may be applied after a predetermined period to terminate the etching reaction.

FIG. 5 a third latitudinal cross section of the schematic diagram of FIG. 1, and may depict a cross section of tuning assembly 100 along latitudinal cross section 5. As shown in FIG. 5, the suspended thermal isolation structure 115 may not extend into the gain section 130.

Figure 6:
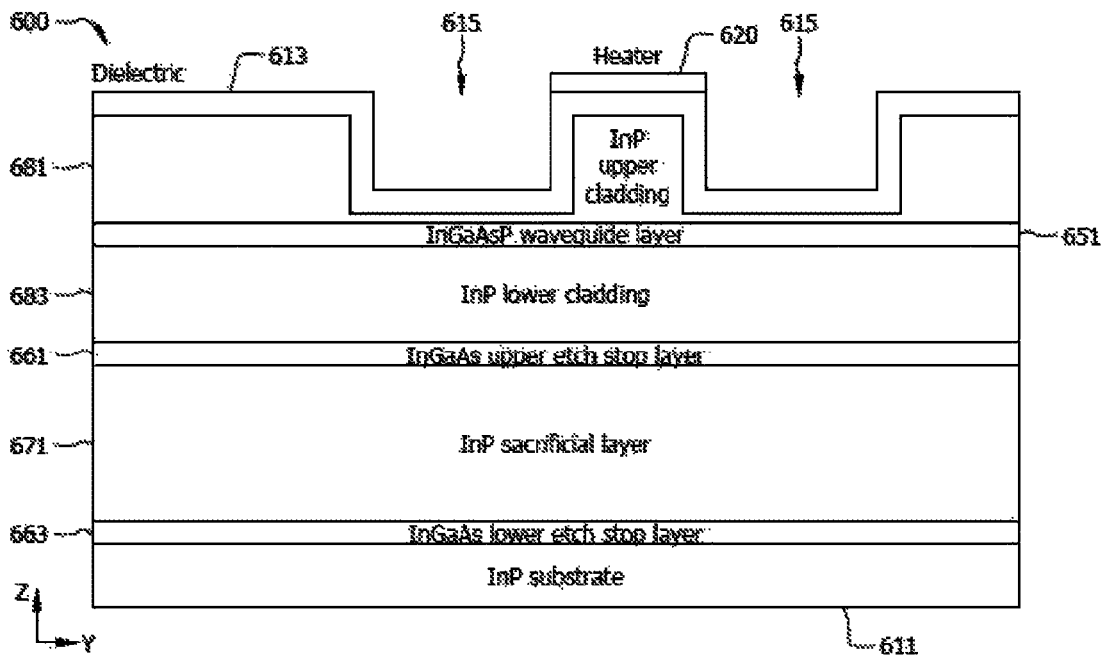
FIG. 6 is an illustration of a first fabrication process step of an embodiment of a thermal tuning assembly.

FIGS. 6-10 may depict a thermal tuning assembly 600 in the latitudinal y axis and the vertical z axis, where the longitudinal x axis is not shown. FIG. 6 is an illustration of a first fabrication process step of an embodiment of a thermal tuning assembly 600, which may be substantially similar to thermal tuning assembly 100. Thermal tuning assembly 600 may be fabricated on a layered substrate that may comprise a InP substrate 611, an InGaAs lower etch stop layer 663, an InP sacrificial layer 671, an InGaAs upper etch stop layer 661, and an InGaAsP waveguide layer 651, which may be substantially similar to InP substrate 111, lower etch stop layer 163, sacrificial layer 171, upper etch stop layer 161, and waveguide layer 151, respectively. Thermal tuning assembly 600 may further comprise an InP upper cladding layer 681, and an InP lower cladding layer 683 to support the waveguide layer 651 and/or the heating element 620. The dielectric layer 613, which may be substantially similar to dielectric layer 113, may be deposited on the upper surface of the substrate before or after application of the heating element 620, depending on embodiment. The heating element 620 may be substantially similar to heating element 120.

In order to create the layered substrate, a base epiwafer may be sequentially grown, via epitaxy, on the InP substrate 611, as discussed in step 1611 of method 1600. For example, the layers may comprise crystals grown by depositing gaseous and/or liquid precursors on the substrate to cause the upper crystal layers to orient during formation according to the orientation of crystals in the lower layers. The InGaAs lower etch stop layer 663 may be grown to a thickness of about 0.2 μm as bottom etch stop for the InP sacrificial layer 671. Then the InP sacrificial layer 671 may be grown to a thickness of about 2.5 μm. The InGaAs upper etch stop layer 661 may then be grown to a thickness of about 0.2 μm, followed by the InP lower cladding layer 683 at a thickness of about 2 μm. Then, the InGaAsP waveguide layer 651 may be grown to a thickness of about 0.3 μm, followed by the InP upper cladding layer 681 at a thickness of about 2 μm. A photolithograph process may be employed to define a ridge structure in the InGaAsP waveguide layer 651 for desired waveguide functionality and/or creation of an opening for a suspended thermal isolation structure 615, as discussed in step 1615 of method 1600. The dielectric layer 613 may then be deposited prior to depositing the heating element 620, as discussed in step 1615 of method 1600. The heating element 620 may be further defined with another photolithograph process.

Figure 7:
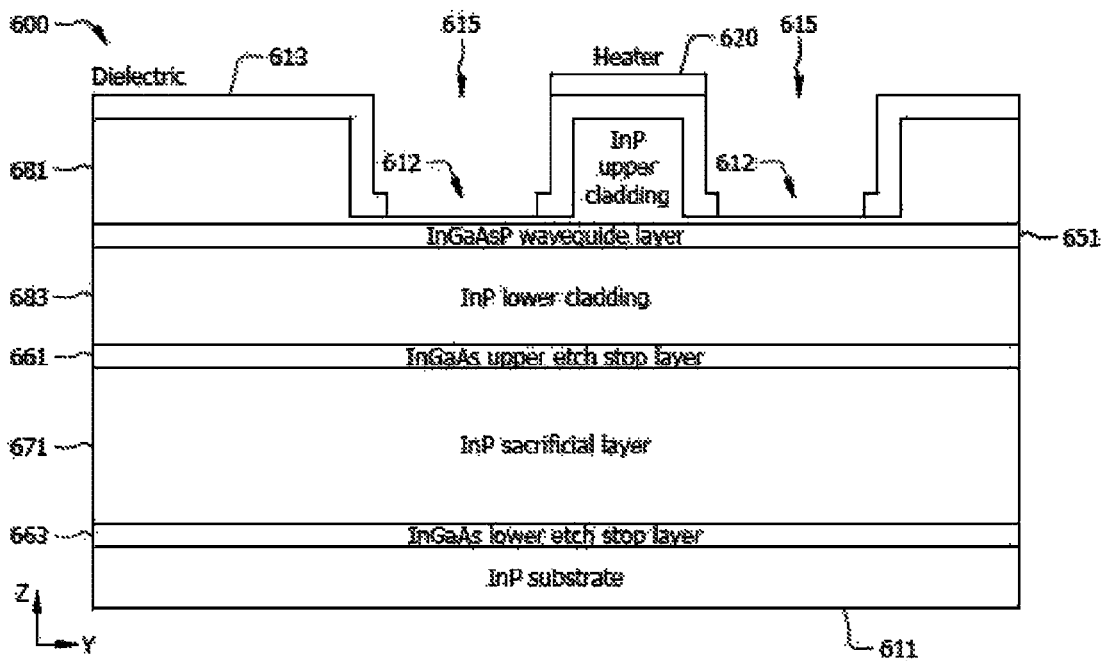
FIG. 7 is an illustration of a second fabrication process step of an embodiment of a thermal tuning assembly.

FIG. 7 is an illustration of a second fabrication process step of an embodiment of a thermal tuning assembly 600. After completion of the growth of the substrate and attachment of the dielectric layer 613 and heating element 620, the dielectric layer 613 may be opened, for example via Reactive-Ion Etching (RIE) and/or wet etching via acidic solutions, as discussed in step 1617 of method 1600. Etching the dielectric layer 613 may result in an opening 612 of about ten μm to support further etching.

Figure 8:
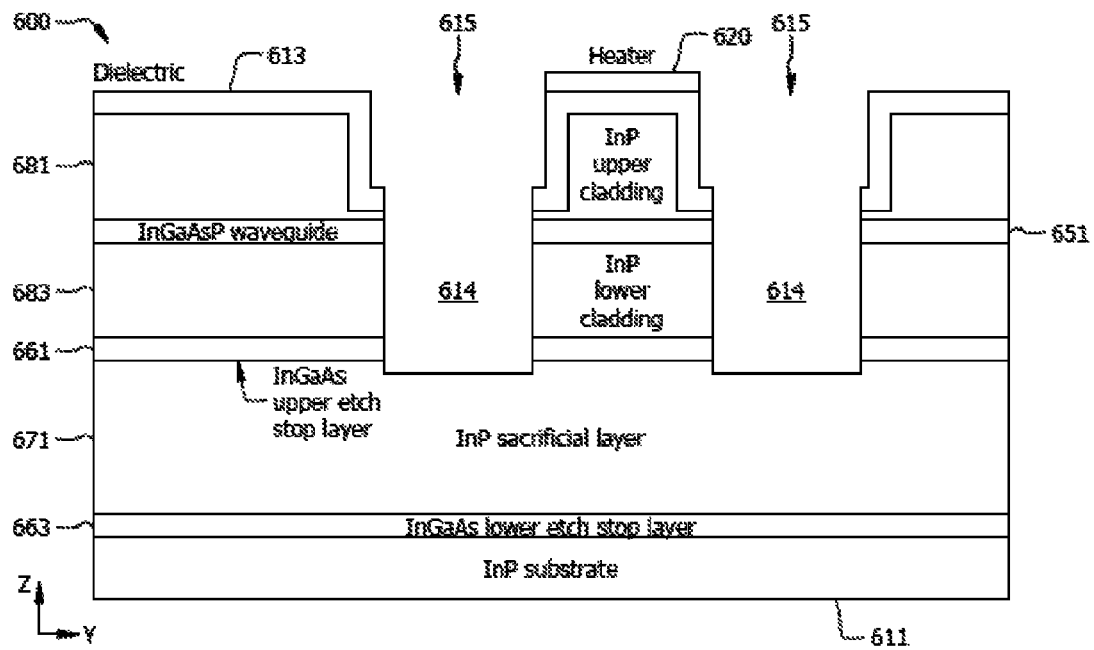
FIG. 8 is an illustration of a third fabrication process step of an embodiment of a thermal tuning assembly.

FIG. 8 is an illustration of a third fabrication process step of an embodiment of a thermal tuning assembly 600. After creating opening 612, a passage 614 may be etched through the upper cladding layer 681, waveguide layer 651, lower cladding layer 683, and the upper etch stop layer 661, as discussed in step 1617 of method 1600. The etching of passage 614 may be accomplished via REI.

Figure 9:
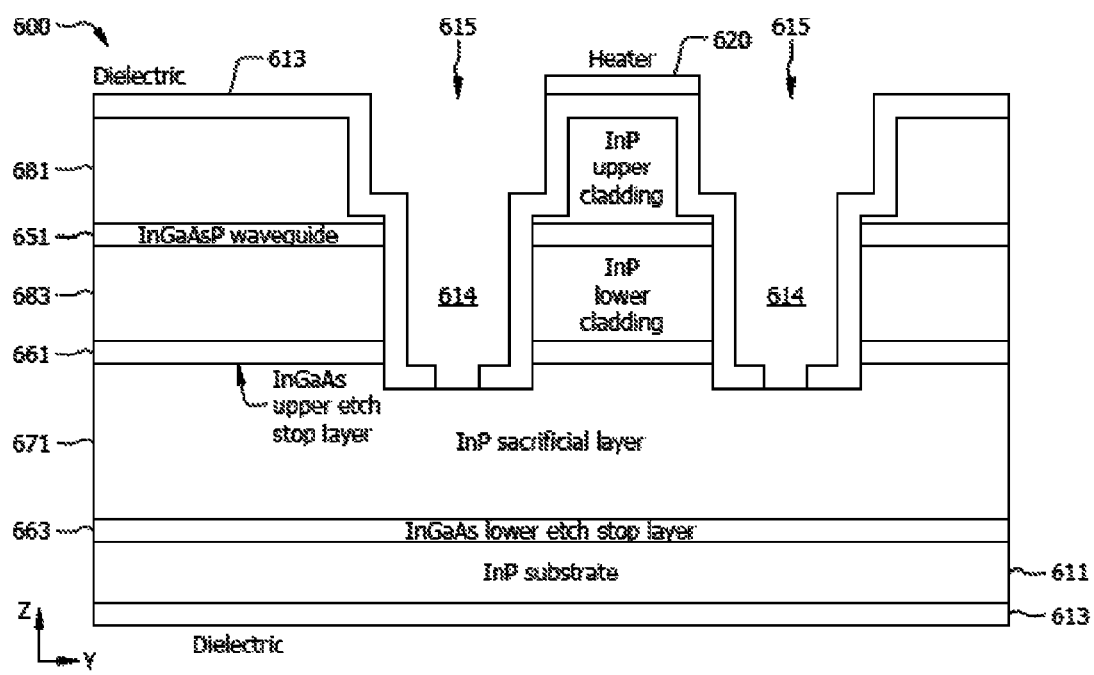
FIG. 9 is an illustration of a fourth fabrication process step of an embodiment of a thermal tuning assembly.

FIG. 9 is an illustration of a fourth fabrication process step of an embodiment of a thermal tuning assembly 600. After etching passage 614, another layer of dielectric 613 may be deposited to protect the sidewall of the passage during further etching of the sacrificial layer 671, as discussed in step 1619 of method 1600. Further, a layer of dielectric 613 may be deposited on a lower surface (e.g. bottom) of the wafer such as SiN and/or SiO2 in order to protect the lower surface of the wafer during further etching of the sacrificial layer 671, as discussed in step 1621 of method 1600. In an alternate embodiment, other protective coatings may be employed on the lower surface, such as Ti, Ti and gold (Au) alloy, etc. Another photolithograph process may also be employed to define another opening of the dielectric for further etching of the sacrificial layer 671.

Figure 10:
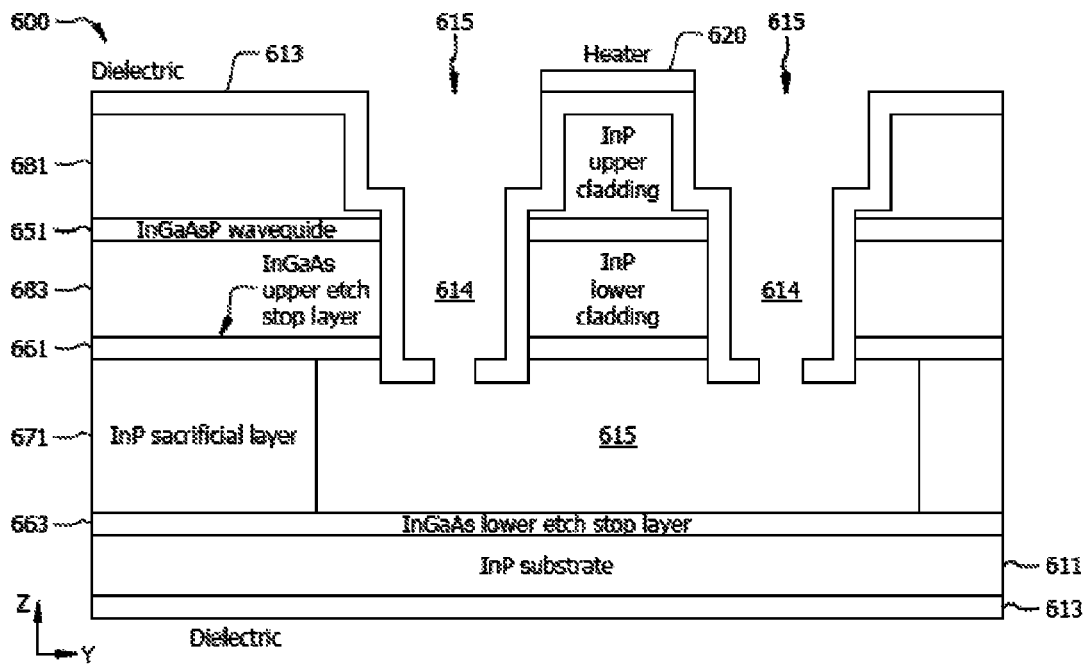
FIG. 10 is an illustration of a fifth fabrication process step of an embodiment of a thermal tuning assembly.

FIG. 10 is an illustration of a fifth fabrication process step of an embodiment of a thermal tuning assembly 600. After depositing additional protective dielectric layers 613, the InP sacrificial layer 671 may be etched away by wet etching, for example by using an aqueous acid agent such as Hydrochloric Acid and water ($HCl:H_2O$), to create the suspended thermal isolation structure 615, as discussed in step 1619 of method 1623. The InGaAs upper etch stop layer 661 and the InGaAs lower etch stop layer 663 may prevent etching outside of the sacrificial layer 671. Further, the dielectric layer 613 may protect the sidewalls of the passage 614. Accordingly, the InP cladding layers 681 and 683 and the waveguide layer 651 may not be affected by the wet etch of the sacrificial layer 671.

Figure 11:
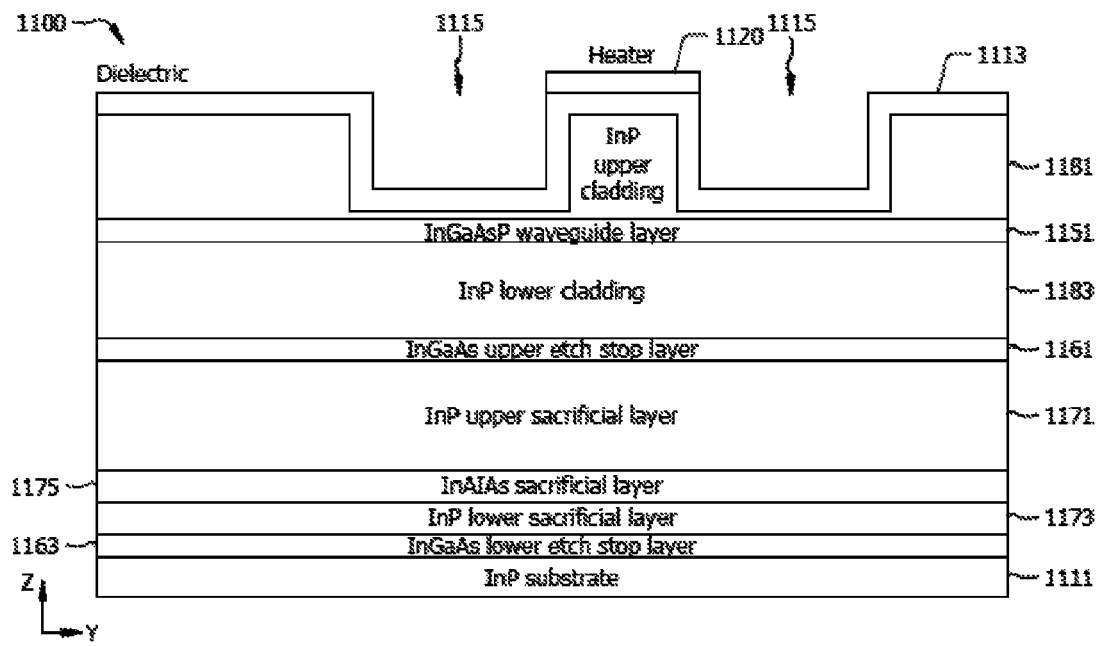
FIG. 11 is an illustration of a first fabrication process step of a second embodiment of a thermal tuning assembly.

FIGS. 11-15 may depict the thermal tuning assembly 1100 in the latitudinal y axis and the vertical z axis, where the longitudinal x axis is not shown. FIG. 11 is an illustration of a first fabrication process step of a second embodiment of a thermal tuning assembly 1100, which may be substantially similar to thermal tuning assembly 100 and/or 600, but may comprise an additional InAlAs sacrificial layer 1175. Thermal tuning assembly 1100 may comprise a heating element 1120, a dielectric layer 1113, an InP upper cladding layer 1181, an InGaAsP waveguide layer 1151, an InP lower cladding layer 1183, an InGaAs upper etch stop layer 1161, an InGaAs lower etch stop layer 1163, and an InP substrate 1111, which may be substantially similar to heating element 620, dielectric layer 613, InP upper cladding layer 681, InGaAsP waveguide layer 651, InP lower cladding layer 683, InGaAs upper etch stop layer 661, InGaAs lower etch stop layer 663, and InP substrate 611. Thermal tuning assembly 1100 may also comprise ridges to support the creation of a suspended thermal isolation structure 1115, which may be substantially similar to suspended thermal isolation structure 615. Thermal tuning assembly 1100 may further comprise an InP upper sacrificial layer 1171 and an InP lower sacrificial layer 1173, which may be similar to InP sacrificial layer 671 but may be separated by InAlAs sacrificial layer 1175.

In some cases, for example if the crystals are grown along certain directions (e.g. vertical), the undercut rate (e.g. etch rate) of the InP sacrificial layer 671 with $HCl:H_2O$ may be relatively slow along a horizontal (e.g. lateral) axis. Accordingly, the InAlAs sacrificial layer 1175 may be grown to a thickness of about 0.5 μm and may be positioned within InP sacrificial layer, resulting in InP upper sacrificial layer 1171 and InP lower sacrificial layer 1173. InAlAs may comprise a much faster lateral undercut rate than InP with $HCl:H_2O$. By employing the InAlAs sacrificial layer 1175 between the InP lower and upper sacrificial layers 1171 and 1173, the high $HCl:H_2O$ etch rate of the InP in the vertical direction may be balanced with the high lateral etch rate of the InAlAs. In other words, the $HCl:H_2O$ may quickly laterally etch the InAlAs sacrificial layer 1175 to position the $HCl:H_2O$ for quick vertical etching of the InP lower and upper sacrificial layers 1171 and 1173 in the vertical layers. By employing both InAlAs and InP as sacrificial layers, the suspended thermal isolation structure 1115 may be etched out in about ten minutes. The thermal tuning assembly 1100 may be grown on an epiwafer in a manner substantially similar to thermal tuning assembly 600 (e.g. steps 1611, 1613, and/or 1615 of method 1600). However, the InP lower sacrificial layer 1173 may be grown to a width of about one μm after the InGaAs lower etch stop layer 1163. Then the InAlAs sacrificial layer 1175 may be grown to a width of about 0.5 followed by growth of the InP upper sacrificial layer 1171 to a thickness of about one μm. Accordingly, layers 1171, 1173, and 1175 may comprise a thickness of about 2.5 which may be substantially the same as InP sacrificial layer 671. Further growth may be substantially the same as thermal tuning assembly 600.

Figure 12:
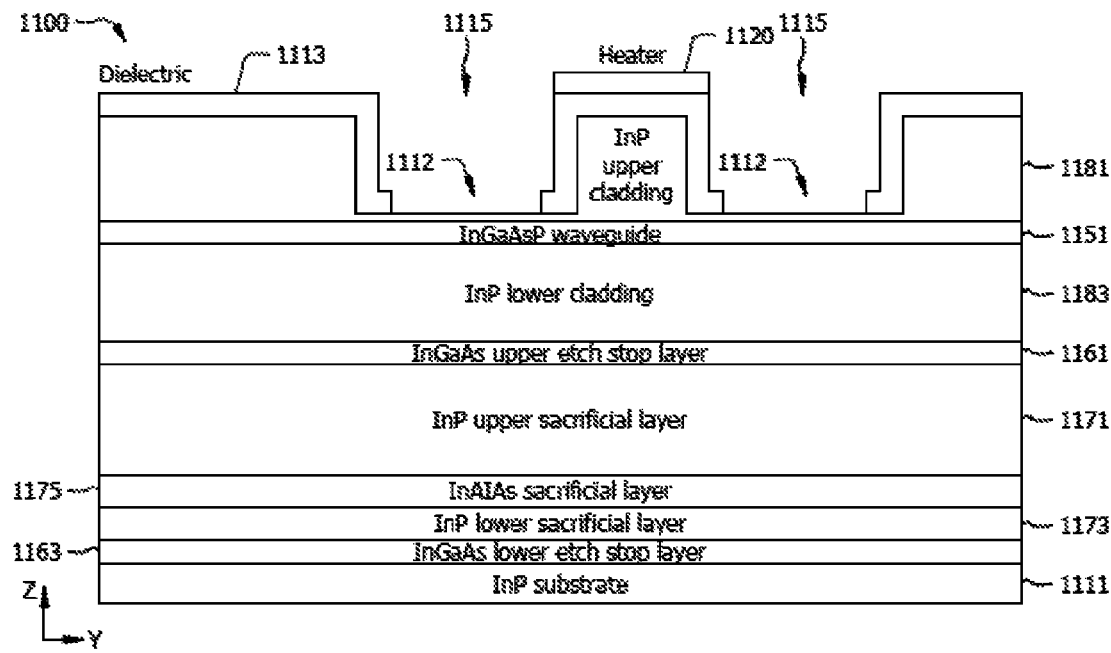
FIG. 12 is an illustration of a second fabrication process step of a second embodiment of a thermal tuning assembly.

FIG. 12 is an illustration of a second fabrication process step of a second embodiment of a thermal tuning assembly 1100, where an opening 1112 may be etched into the dielectric in a manner similar to opening 612 (e.g. step 1617 method 1600).

Figure 13:
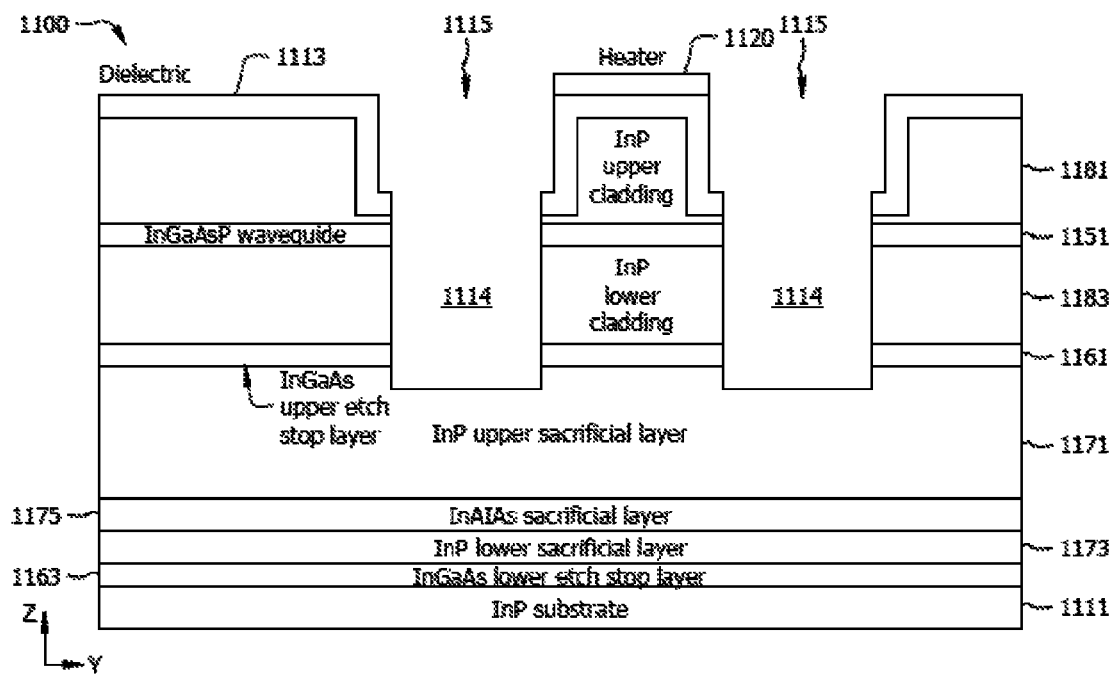
FIG. 13 is an illustration of a third fabrication process step of a second embodiment of a suspended thermal isolation structure.

FIG. 13 is an illustration of a third fabrication process step of a second embodiment of a thermal tuning assembly 1100, where a passage 1114 may be etched into the layered substrate to extend past the InGaAs upper etch stop layer 1161, in a manner similar to passage 614 (e.g. step 1617 method 1600).

Figure 14:
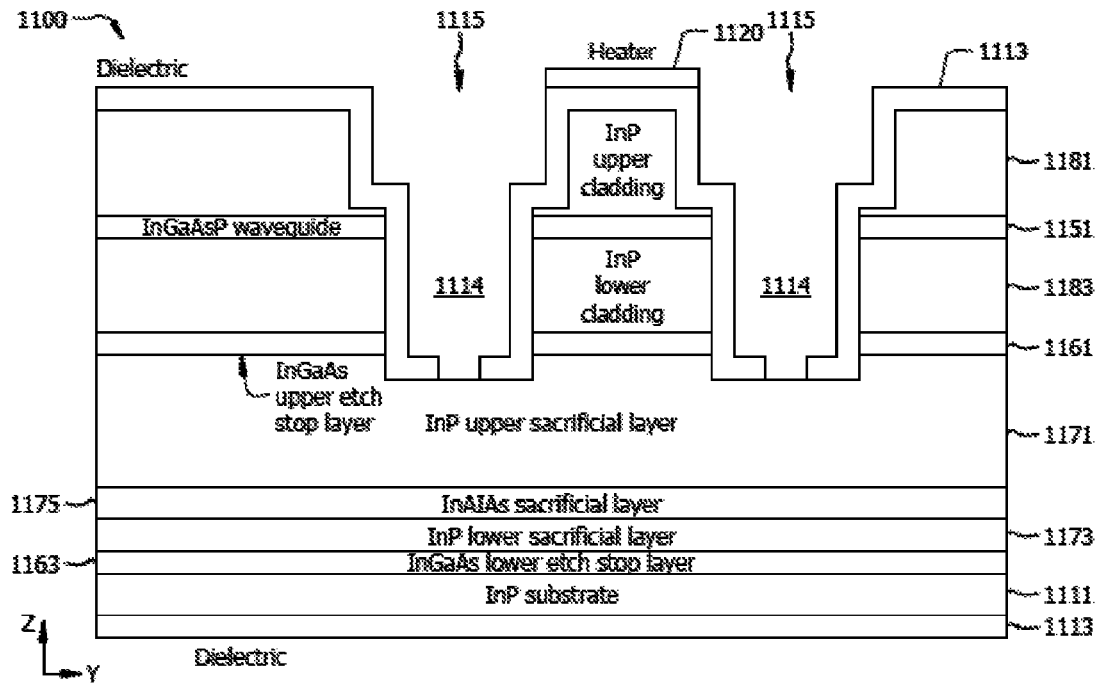
FIG. 14 is an illustration of a fourth fabrication process step of a second embodiment of a thermal tuning assembly.

FIG. 14 is an illustration of a fourth fabrication process step of a second embodiment of a thermal tuning assembly 1100, where sidewalls of the passage 1114 and the lower surface of the wafer may be coated with additional layers of dielectric 1113 for protection in a manner similar to passage 614 and 613, respectively (e.g. steps 1619 and 1621 of method 1600).

Figure 15:
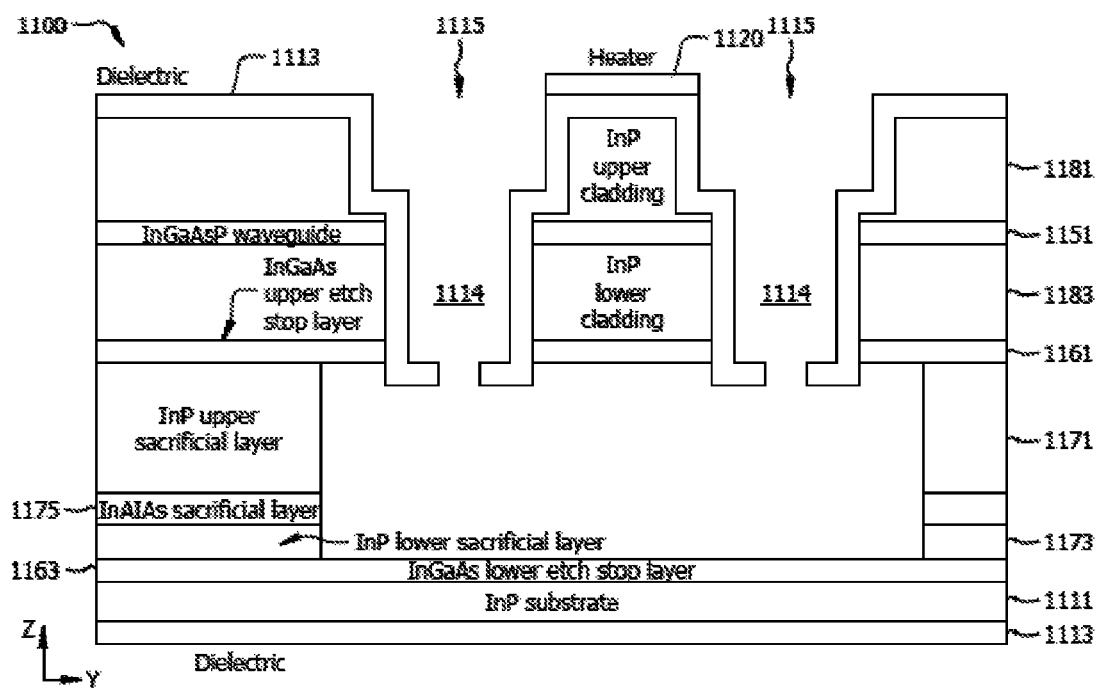
FIG. 15 is an illustration of a fifth fabrication process step of a second embodiment of a thermal tuning assembly.

FIG. 15 is an illustration of a fifth fabrication process step of a second embodiment of a thermal tuning assembly 1100. Etching solution may be poured into the passages 1114 to etch out suspended thermal isolation structure 1115 in a manner similar to suspended thermal isolation structure 615 (e.g. step 1623 method 1600). However, the faster lateral etch of the InAlAs sacrificial layer 1175 combined with the faster vertical etch of the InP upper and lower sacrificial layers 1171 and 1173 may speed the overall etch time versus sacrificial layer 671 as discussed above.

Figure 16:
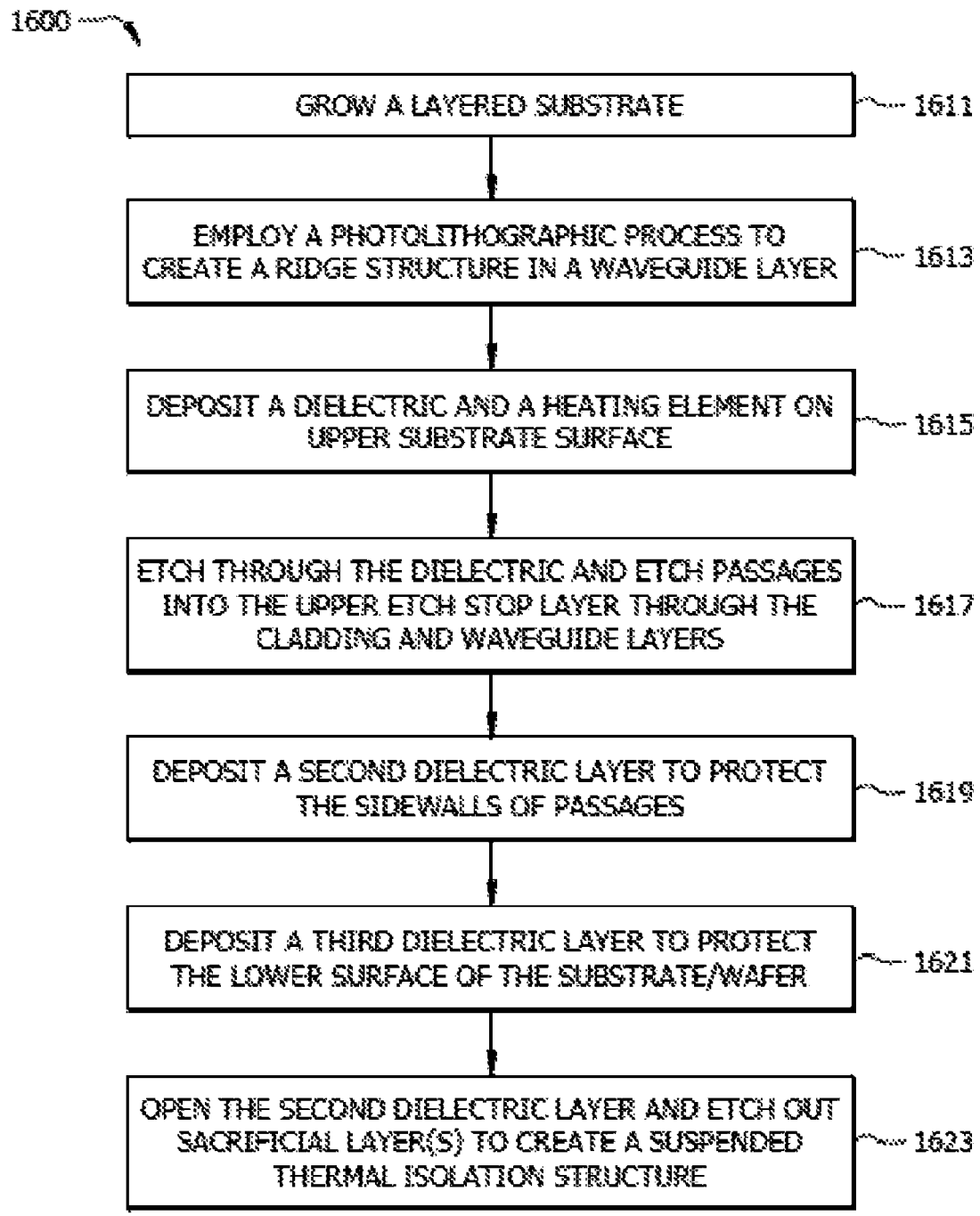
FIG. 16 is a flowchart of an embodiment of a method of fabricating a thermal tuning assembly for a monolithically integrated tunable laser.

FIG. 16 is a flowchart of an embodiment of a method 1600 of fabricating a thermal tuning assembly for a monolithically integrated tunable laser, such as thermal tuning assembly 100, 600, and/or 1100. At step 1611, a layered substrate, such as layered substrate 110, may be grown, for example via epitaxy as discussed herein above. The layered substrate may comprise an InP sacrificial layer, an InAlAs sacrificial layer, or combinations thereof. At step 1613, a photolithographic process may be employed to create a ridge structure in a waveguide layer, such as waveguide layer 651 and/or 1151. At step 1615, a dielectric layer (e.g. dielectric layer 613 and/or 1113) and a heating element (e.g. heating element 620 and/or 1120) may be deposited on the upper surface of the layered substrate. At step 1617, the method 1600 may etch through the dielectric layer and then etch passages (e.g. passages 614 and/or 1114) into an upper etch stop layer via InP cladding layers (e.g. cladding layers 681, 683, 1181, and/or 1183) and the waveguide layer. At step 1619, a second layer of dielectric may be deposited to protect the sidewalls of the passages. At step 1621, a third layer of dielectric and/or other materials (e.g. metals) may be deposited to protect the lower surface of the substrate/wafer. At step 1623, the second dielectric layer may be opened and the sacrificial layer(s) may be etched out to create a suspended thermal isolation structure, such as suspended thermal isolation structure 615 and/or 1115.

At least one embodiment is disclosed and variations, combinations, and/or modifications of the embodiment(s) and/or features of the embodiment(s) made by a person having ordinary skill in the art are within the scope of the disclosure. Alternative embodiments that result from combining, integrating, and/or omitting features of the embodiment(s) are also within the scope of the disclosure. Where numerical ranges or limitations are expressly stated, such express ranges or limitations should be understood to include iterative ranges or limitations of like magnitude falling within the expressly stated ranges or limitations (e.g. from about 1 to about 10 includes, 2, 3, 4, etc.; greater than 0.10 includes 0.11, 0.12, 0.13, etc.). For example, whenever a numerical range with a lower limit, $R_l$, and an upper limit, $R_u$, is disclosed, any number falling within the range is specifically disclosed. In particular, the following numbers within the range are specifically disclosed: $R=R_l+k*(R_u-R_l)$, wherein k is a variable ranging from 1 percent to 100 percent with a 1 percent increment, i.e., k is 1 percent, 2 percent, 3 percent, 4 percent, 7 percent, . . . , 70 percent, 71 percent, 72 percent, . . . , 97 percent, 96 percent, 97 percent, 98 percent, 99 percent, or 100 percent. Moreover, any numerical range defined by two R numbers as defined in the above is also specifically disclosed. Unless otherwise stated, the term "about" means±10% of the subsequent number. Use of the term "optionally" with respect to any element of a claim means that the element is required, or alternatively, the element is not required, both alternatives being within the scope of the claim. Use of broader terms such as comprises, includes, and having should be understood to provide support for narrower terms such as consisting of, consisting essentially of, and comprised substantially of. Accordingly, the scope of protection is not limited by the description set out above but is defined by the claims that follow, that scope including all equivalents of the subject matter of the claims. Each and every claim is incorporated as further disclosure into the specification and the claims are embodiment(s) of the present disclosure. The discussion of a reference in the disclosure is not an admission that it is prior art, especially any reference that has a publication date after the priority date of this application. The disclosure of all patents, patent applications, and publications cited in the disclosure are hereby incorporated by reference, to the extent that they provide exemplary, procedural, or other details supplementary to the disclosure.

While several embodiments have been provided in the present disclosure, it should be understood that the disclosed systems and methods might be embodied in many other specific forms without departing from the spirit or scope of the present disclosure. The present examples are to be considered as illustrative and not restrictive, and the intention is not to be limited to the details given herein. For example, the various elements or components may be combined or integrated in another system or certain features may be omitted, or not implemented.

In addition, techniques, systems, subsystems, and methods described and illustrated in the various embodiments as discrete or separate may be combined or integrated with other systems, modules, techniques, or methods without departing from the scope of the present disclosure. Other items shown or discussed as coupled or directly coupled or communicating with each other may be indirectly coupled or communicating through some interface, device, or intermediate component whether electrically, mechanically, or otherwise. Other examples of changes, substitutions, and alterations are ascertainable by one skilled in the art and could be made without departing from the spirit and scope disclosed herein.

What is claimed is:

1. A monolithically integrated thermal tunable laser, comprising:
    a layered substrate, comprising:
        a plurality of Indium Gallium Arsenide (InGaAs) etch stop layers; and
        an Indium Aluminum Arsenide (InAlAs) sacrificial layer positioned between the plurality of InGaAs etch stop layers;
    a heating element attached to the layered substrate; and
    a thermal isolation layer etched into the layered substrate and bounded by the InGaAs etch stop layers;
        wherein a portion of the InAlAs sacrificial layer is etched out to create the thermal isolation layer.

2. The thermal tunable laser of claim 1, wherein a suspended thermal isolation structure is positioned substantially above the thermal isolation layer.

3. The thermal tunable laser of claim 1, further comprising an Indium Phosphide (InP) sacrificial layer positioned between the plurality of InGaAs etch stop layers, wherein the InAlAs sacrificial layer is positioned at least partially inside the InP sacrificial layer.

4. The thermal tunable laser of claim 3, wherein the InAlAs sacrificial layer is positioned completely inside the InP sacrificial layer.

5. The thermal tunable laser of claim 3, wherein the InAlAs sacrificial layer is positioned to support etching along a horizontal axis, and wherein the InP sacrificial layer is positioned to support etching along a vertical axis.

6. The thermal tunable laser of claim 1, further comprising a waveguide layer positioned between the heating element and an upper InGaAs etch stop layer of the plurality of InGaAs etch stop layers.

7. The thermal tunable laser of claim 1, wherein the upper surface of the layered substrate comprises a dielectric layer and wherein the layered substrate further comprises:
    an InP based cladding layer, wherein the plurality of InGaAs etch stop layers comprise an upper etch stop layer and a lower etch stop layer, and wherein the cladding layer is positioned between the dielectric layer and the upper etch stop layer.

8. The thermal tunable laser of claim 1, wherein the thermal tunable laser further comprises a front mirror and a back mirror, wherein the heating element is positioned between the mirrors, and wherein at least one of the mirrors is configured to selectively reflect light traversing the waveguide layer based on heat generated by the heating element.

9. The thermal tunable laser of claim 1, wherein the heating element comprises Titanium (Ti), Platinum (Pt), or combinations thereof.

10. The thermal tunable laser of claim 1, wherein the heating element is configured to selectively change a local temperature to selectively tune a wavelength of an optical signal.

11. The thermal tunable laser of claim 1, wherein the heating element is configured to heat a mirror, a waveguide, or both based on an electrical input.

12. A monolithically integrated thermal tunable laser, comprising:
   a layered substrate, comprising:
      a plurality of Indium Gallium Arsenide (InGaAs) etch stop layers;
      an Indium Phosphide (InP) sacrificial layer positioned between the plurality of InGaAs etch stop layers; and
      an Indium Aluminum Arsenide (InAlAs) sacrificial layer positioned between the plurality of InGaAs etch stop layers and positioned at least partially inside the InP sacrificial layer;
   a heating element attached to the layered substrate; and
   a thermal isolation layer etched into the layered substrate and bounded by the plurality of InGaAs etch stop layers;
      wherein at least a first portion of the InP sacrificial layer is etched out to create the thermal isolation layer; and
      wherein at least a first portion of the InAlAs sacrificial layer is etched out to complete the thermal isolation layer.

13. The thermal tunable laser of claim 12, wherein a suspended thermal isolation structure is positioned substantially above the thermal isolation layer.

14. The thermal tunable laser of claim 12, wherein the InAlAs sacrificial layer is positioned completely inside the InP sacrificial layer.

15. The thermal tunable laser of claim 12, wherein the InAlAs sacrificial layer is positioned to support etching along a horizontal axis, and wherein the InP sacrificial layer is positioned to support etching along a vertical axis.

16. The thermal tunable laser of claim 12, wherein the InAlAs sacrificial layer is the only InAlAs layer in the thermal tunable laser.

17. The thermal tunable laser of claim 12, further comprising a waveguide layer positioned between the heating element and an upper InGaAs etch stop layer of the plurality of InGaAs etch stop layers.

18. The thermal tunable laser of claim 12, wherein the upper surface of the layered substrate comprises a dielectric layer and wherein the layered substrate further comprises:
   an InP based cladding layer, wherein the plurality of InGaAs etch stop layers comprise an upper etch stop layer and a lower etch stop layer, and wherein the cladding layer is positioned between the dielectric layer and the upper etch stop layer.

19. The thermal tunable laser of claim 12, wherein the thermal tunable laser further comprises a front mirror and a back mirror, wherein the heating element is positioned between the mirrors, and wherein at least one of the mirrors is configured to selectively reflect light traversing the waveguide layer based on heat generated by the heating element.

20. The thermal tunable laser of claim 12, wherein the heating element comprises Titanium (Ti), Platinum (Pt), or combinations thereof.

21. The thermal tunable laser of claim 12, wherein the heating element is configured to selectively change a local temperature to selectively tune a wavelength of an optical signal.

22. The thermal tunable laser of claim 12, wherein the heating element is configured to heat a mirror, a waveguide, or both based on an electrical input.

* * * * *